United States Patent [19]

Conanan

[11] Patent Number: 4,888,596
[45] Date of Patent: Dec. 19, 1989

[54] METHOD AND APPARATUS FOR DETERMINING EARTH STATION PARAMETERS SUCH AS RAIN MARGIN, WITH ATTENUATION PADS

[75] Inventor: Virgilio D. Conanan, New Milford, N.J.

[73] Assignee: Home Box Office, Inc., New York, N.Y.

[21] Appl. No.: 183,596

[22] Filed: Apr. 19, 1988

[51] Int. Cl.$^4$ .................... H01Q 17/00; H01Q 13/00
[52] U.S. Cl. ................................. 343/703; 343/786; 343/909; 342/174; 455/12
[58] Field of Search ............. 343/703, 782, 785, 786, 343/909; 455/12; 342/173, 174; 324/95

[56] References Cited

U.S. PATENT DOCUMENTS

| | | | |
|---|---|---|---|
| 4,301,533 | 11/1981 | Acampora et al. | 455/10 |
| 4,309,764 | 1/1982 | Acampora | 455/12 |
| 4,495,506 | 1/1985 | Sasser et al. | 343/909 |
| 4,761,055 | 8/1988 | Hatje | 343/909 |
| 4,776,035 | 10/1988 | Duggan | 455/69 |

FOREIGN PATENT DOCUMENTS 8703441 6/1987 World Int. Prop. O. ............ 455/69

*Primary Examiner*—Rolf Hille
*Assistant Examiner*—Doris J. Johnson
*Attorney, Agent, or Firm*—Kevin McMahon; Daniel A. DeVito

[57] ABSTRACT

Methods and apparatus for determining operating parameters, such as rain margin, of an antenna by attenuating the received signal by, for example, the use of calibrated attenuation pads, the method comprising placing such pads in front of the horn of the antenna feed until impulses appear on the screen of a T.V. or monitor connected to the antenna. The antenna alignment is peaked by determining the orientation of the antenna that yields the minimum impulses. The rain or impulse noise margin is determined by summing the attenuation factors of the pads with the increase in delta G/T due to the attenuation. The tuning of the receiver can be checked by observing the number of black and white impulses. The positioning of the antenna with respect to the polarization of the signal can be checked by determining the rotational position of the feedhorn which yields the minimum number of impulses. The descrambler dropout margin and clear sky carrier-to-noise ratio are determined by the addition of proper constants. The antenna can be a Ku-band antenna. A set of pads related, for example, by powers of two, for use in determining operational parameters of an antenna is also disclosed. By use of these methods and apparatus, the antenna system's conformance with specification requirements can be determined.

30 Claims, 4 Drawing Sheets

METHOD AND APPARATUS FOR DETERMINING EARTH STATION PARAMETERS SUCH AS RAIN MARGIN, WITH ATTENUATION PADS

FIELD OF THE INVENTION

A method and apparatus for determining operational parameters of an earth based receiving system and more particularly, a method for determining the rain margin of a Ku-band satellite ground station receiving antenna by use of calibrated microwave absorbing pads.

BACKGROUND OF THE INVENTION

I. Satellite Ground Station Requirements

The Fixed Satellite Service (FSS) downlink frequency band at 11.7 to 12.2 GHZ, commonly called the Ku-band, has been gaining wide acceptance as a reliable television transmission medium. One factor contributing to this has been higher power transponders enabling small aperture antennas to produce high quality television signals. The FCC has assigned the Ku-band primarily to satellite transmission, freeing it from terrestrial microwave interference. There have also been significant developments in semiconductor technology, design and manufacturing techniques which have resulted in the improved performance of earth station hardware while reducing installation and maintenance costs. Finally, after years of propagation studies and operational experience, the effects of precipitation and proper link design are now well understood.

When operating at frequencies above 10 GHZ, which includes the Ku-band, the most basic and important television earth station parameter is rain margin. Rain margin is the additional carrier-to-noise power ratio ("C/N") at which a ground receiving station must operate above the C/N that is required for adequate reception under clear sky conditions in order to compensate for the effects of increased attenuation resulting from adverse atmospheric conditions such as rain, sleet and snow. More generally, such margin is referred to as the impulse noise margin. If C/N drops too low, the video picture quality is degraded. Impulses or "sparklies" appear on the screen and at some point the picture is lost entirely. Studies have shown that attenuation caused by rain is the dominant factor to be considered in deciding how much margin is required in ground station design. The larger the margin, the greater the ability of the system to maintain a clear picture despite precipitation caused signal attenuation.

The required rain margin is chosen by users according to their criteria for acceptable signal quality during precipitation and the expected frequency and severity of such precipitation. These decisions are normally based on data published by the International Radio Consultative Committee for various geographical areas of the United States or on similar data for other countries.

In earth station design, C/N can be increased by increasing the antenna gain through improved efficiency and by using larger apertures and amplifiers with lower noise figures. Decreased C/N can be caused by lower satellite Effective Isotropic Radiated Power (EIRP). Antenna related problems which could decrease C/N include antenna equipment malfunction, improper antenna installation, antenna misalignment, polarization misadjustment and receiver detuning.

When an antenna system is installed, normal engineering practice requires that its operational parameters, including its rain margin, be tested to ensure conformance with specifications. A number of techniques have been used in the past to measure a ground station's C/N to determine whether adequate rain margin exists. In a commonly used method involving the use of a power meter attached to the ground station's amplifier output, C/N is measured by taking the ratio of the output during "clear sky" reception to the power output resulting from noise when the carrier is not present. Noise power can be measured by pointing the antenna away from the satellite or by turning off the carrier signal at the transmitting satellite. For more accurate results, the measured noise power is subtracted from the carrier measurement before the ratio is determined. In this case, $$C/N = 10 \, \text{Log}[(C+N)-N]/N$$

where C+N is the measured power with the carrier present and N is the measured noise power with the carrier absent. One disadvantage of this method is the requirement for extra equipment such as the power meter and a bandpass filter. In addition, there is a disruption in programming. Furthermore, if the carrier signal is removed by redirecting the antenna, additional manpower may be required for assistance, one does not measure the true noise level in the direction of the satellite and it is possible to pick up stray signals from other sources.

Another technique for measuring C/N involves the use of a spectrum analyzer to directly measure the carrier and noise power components of the earth station output. Spectrum analyzers, however, are not generally used with modulated transponders because their narrow reception band cannot capture the entire range of transmitted signals. In many pay television services, unmodulated carriers are only transmitted for testing once a month.

Other methods for determining C/N involve measurements made by pointing the antenna at a known noise source, such as a radio star or a NBS calibrated noise generator and calculations based on measurements of the demodulated baseband video signal to RMS noise ratio.

Still another prior method for measuring the earth station's C/N requires connecting a variable waveguide attenuator between the receiving antenna horn and the ground station amplifier. The total received signal, which includes the carrier signal plus noise (C+N), is first measured during normal programming reception. Then a waveguide attenuator is inserted between the horn and LNA (low noise amplifier) or LNB (low noise block converter) of the ground station. A bandpass filter is also placed between the output of the amplifier and the power meter to restrict the measurement to the range of interest. The received signal is then completely attenuated and the noise is measured. C/N can then be calculated by the formula discussed above.

This attenuation also causes an increase in system noise. System noise affects C/N and another indicator of antenna performance, G/T. G/T is the ratio between antenna gain in decibels and equivalent system noise temperature in degrees Kelvin, and indicates the efficiency (figure-of-merit) of the satellite earth station. Since system noise is directly related to the system temperature, as attenuation is increased, total noise or system temperature also increases, further degrading C/N. The increase in system noise due to attenuation is equal to delta G/T. The amount of attenuation required to cause impulses, plus delta G/T, is the station's impulse noise margin.

The use of a waveguide attenuator is accurate, but the and bandpass filter can cost between $3,000–$5,000. It also requires the dismantling of the antenna system. Furthermore, T.V. reception must be disrupted for long periods of time. In addition, since the attenuator itself is a source of noise, one is not measuring the actual noise of the antenna system itself. Minimization of this extra noise requires careful instrumentation to properly match the input and output impedances of the attenuator to the output and input impedances of the horn and LNA/LNB, respectively. The addition of the attenuator may also require a repositioning of the horn, which could remove it from the focal point of the amplifying dish.

Other problems exist with currently available techniques for setting up a satellite ground station antenna and optimizing its performance. One such aspect of antenna installation is the proper alignment of the antenna in relation to the satellite. Because of the narrow bandwidth of Ku-band antennas, a small pointing error in azimuthal or elevational angle could reduce the received carrier signal by several decibels. This might not affect T.V. reception on a clear day but it does decrease one's rain margin, potentially interfering with reception during precipitation. Proper alignment, referred to as peaking, can be obtained through the measurement of the carrier level indicator on the receiver or the measurement of AGC (Automatic Gain Control) with a voltmeter. A power meter or spectrum analyzer can also be used. These techniques present the same problems as discussed above in relation to determining C/N.

An additional aspect of the antenna that could need to be adjusted for optimum reception is the receiver tuning. Some receivers include a meter for indicating the tuning. Others have an automatic fine tuning control. This could add additional costs to the antenna system, and can still require testing to ensure proper operation.

A further required adjustment of the antenna system is its resolution of signal polarization. Proper alignment with the horizontal and vertical components of the transmitted electromagnetic wave is required for optimum reception. In a typical configuration, the antenna feedhorn is connected to an orthomode transducer which splits th received signal into its horizontal and vertical components. These components are then amplified by distinct LNAs or LNBs. The feedhorn, transducer and LNA/LNB are rigidly connected so that rotation of the feedhorn changes the rotational position of the transducer and LNA/LNB in relation to the polarization of the incoming wave. The proper alignment can be determined with a power meter by monitoring the power level of one of the LNBs amplifying one component of the incoming signal, while rotating the feedhorn. The rotational position yielding the minimum and maximum power level for a horizontally or vertically polarized wave can then be determined. Because the two LNBs are already adjusted to receive signals 90° to apart from one and other, the position yielding a minimum power reading for one component will be the optimum position for the other component. Generally, this minimum, or null, can be more accurately determined than a maximum. The null position of either the horizontal or vertical component of the carrier signal will, therefore, determine the proper orientation of the feedhorn with respect to both.

Some antennas include a resonant element to couple the signal received by the feedhorn to the amplifier. The orientation of this probe can be varied to be in alignment with either the horizontal or vertical component of the signal. The optimum position of the probe, which can be driven by a motor, can be determined with a power meter by determining the position of the probe yielding the maximum power level.

II. Microwave Absorbing Materials

Microwave absorbing materials have a wide range of applications, particularly in the area of the control of electrostatic discharge. Electronic equipment, particularly integrated circuits, are sensitive to damage caused by static electricity. Static shielding bags, wraps, and foams, for example, have been developed to protect integrated circuits by absorbing and dissipating static electricity. Other applications of microwave absorbing materials include preventing undesirable reflections in radar antennas, or of planes and ships, and in anechoic chambers for testing antennas and radar cross sections.

Microwave absorbing materials typically consist of a dielectric carrier coated or impregnated with a conductive material. Suitable dielectric carriers include plastic polymers, paper, glass or cloth. Any conductor which can be used to treat the polymer and provide the necessary resistivity can be used.

Possible dielectric polymer carrier materials include polyethylene, polystyrene and polyester foams, molded polypropylene and polyethylene, and acrylic polyurethane. These plastics can be made conductive through the use of additives at the compounding stage or by coating or impregnating the plastic with a conductive material.

Various methods for making a plastic polymer conductive are discussed in Mooney, "Mastering ESD Plastics in Static Control Products Market," EMC Technology and Interference Control News, Vol. 7, No. 1, pages 14–16, February, 1988.

One suggested method is to add carbon particles to a polymer carrier to create conductive paths through electron tunneling. The efficiency of such tunneling depends on the average interaggregate distance between carbon particles. Referred to as "carbon black polymers," the conductivity of such treated polymers is also dependant on the void volume, particle diameter, structure, surface chemistry and physical form.

Metallic fibers and flakes can also be used to increase the conductivity of plastics. Aluminum, stainless steel, nickel or aluminum coated glass are the most commonly used.

SUMMARY OF THE INVENTION

According to the method of the present invention, operational parameters of an antenna connected to a T.V. or monitor, such as the impulse noise margin, can be determined by (a) attenuating the received signal under clear sky conditions until impulse noise or sparklies appear on the T.V. or monitor screen, (b) determining the amount of attenuation required to cause the impulses and (c) adding this to the delta G/T due to the attenuation to yield the antenna's rain margin.

More particularly, in the preferred embodiment the received signal can be attenuated by placing calibrated attenuation pads in front of the mouth of the antenna feedhorn to attenuate the signal, summing the attenuation factors of the pads and adding to it delta G/T.

The optimum antenna position can be determined in accordance with the method of the present invention by placing attenuation pads over the mouth of the antenna feedhorn until impulses appear on the screen and varying the azimuthal and elevational angles to determine the position yielding the minimum number of impulses.

Similarly, the position of the antenna to match the signal polarization can also be optimized in accordance with the method of the present invention by rotating the feedhorn with enough attenuation pads present to cause impulses to appear on the screen and determining the position yielding the minimum number of impulses.

Optimum receiver tuning can also be checked in accordance with the method of the present invention by observing the number of white and black impulses while the pads are in place. Optimum tuning exists when the number of black impulses approximately equals the number of white impulses.

Other operational parameters of the antenna system, such as the descrambler dropout margin and the clear sky carrier-to-noise ratio, can be determined according to the method of the present invention by the addition of suitable constants to the impulse noise margin.

Also according to the present invention, a set of attenuation pads having different known attenuative strengths can be used to determine the operational parameters discussed above. The pads' attenuative strengths are related to each other in such a way that any attenuation up to the sum of the attenuation of all the pads can be determined to a resolution equal to the attenuation of the pad with the smallest attenuation. The pads can be related to each other by the powers of 2.

DESCRIPTION OF THE INVENTION

Figure 1:
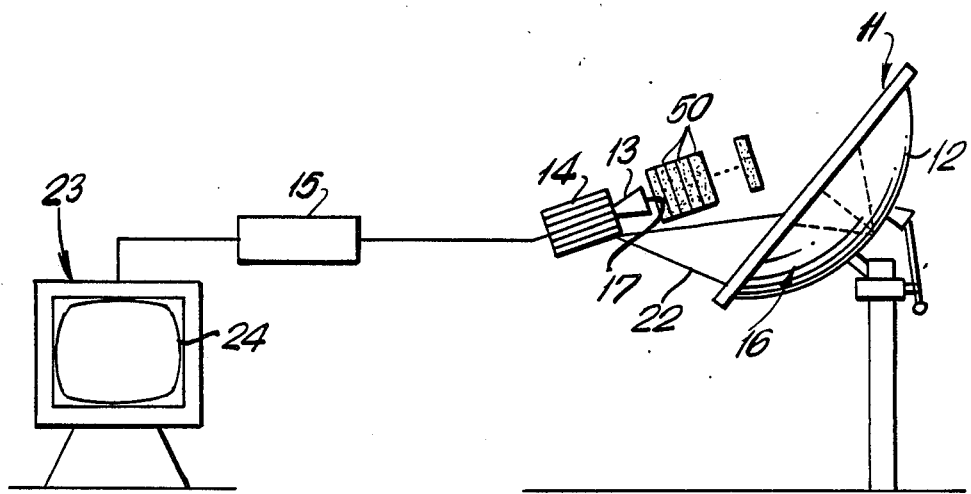
FIG. 1 is a partial schematic diagram of an antenna system installation showing the use of attenuation pads in accordance with the methods of the present invention.

FIG. 1 shows a typical Ku-band satellite dish antenna 11, with an amplifying dish 12 and an antenna feedhorn 13. The output of the antenna feedhorn 13 is connected to a low noise amplifier ("LNA") or low noise block converter ("LNB") 14. The output of the LNA/LNB 14 is connected to the receiver 15, whose output is connected to a T.V. 23. Proper installation of the antenna 11 involves mounting on a stable surface, proper positioning of the dish panels 16 and placement of the feed horn 13 exactly at the focal point of the amplifying dish 12. Optimal performance requires "peaking" the antenna 11, by aligning it properly with the satellite.

Figure 3:
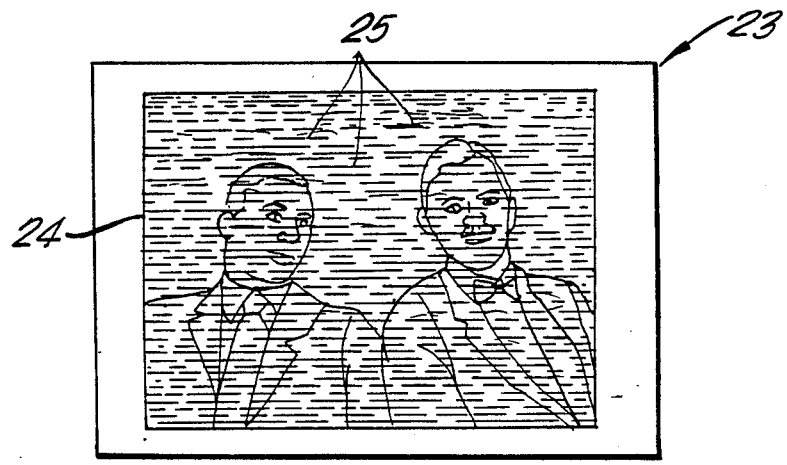
FIG. 3 shows the effect of impulse noise on a T.V. screen.
Figure 2:
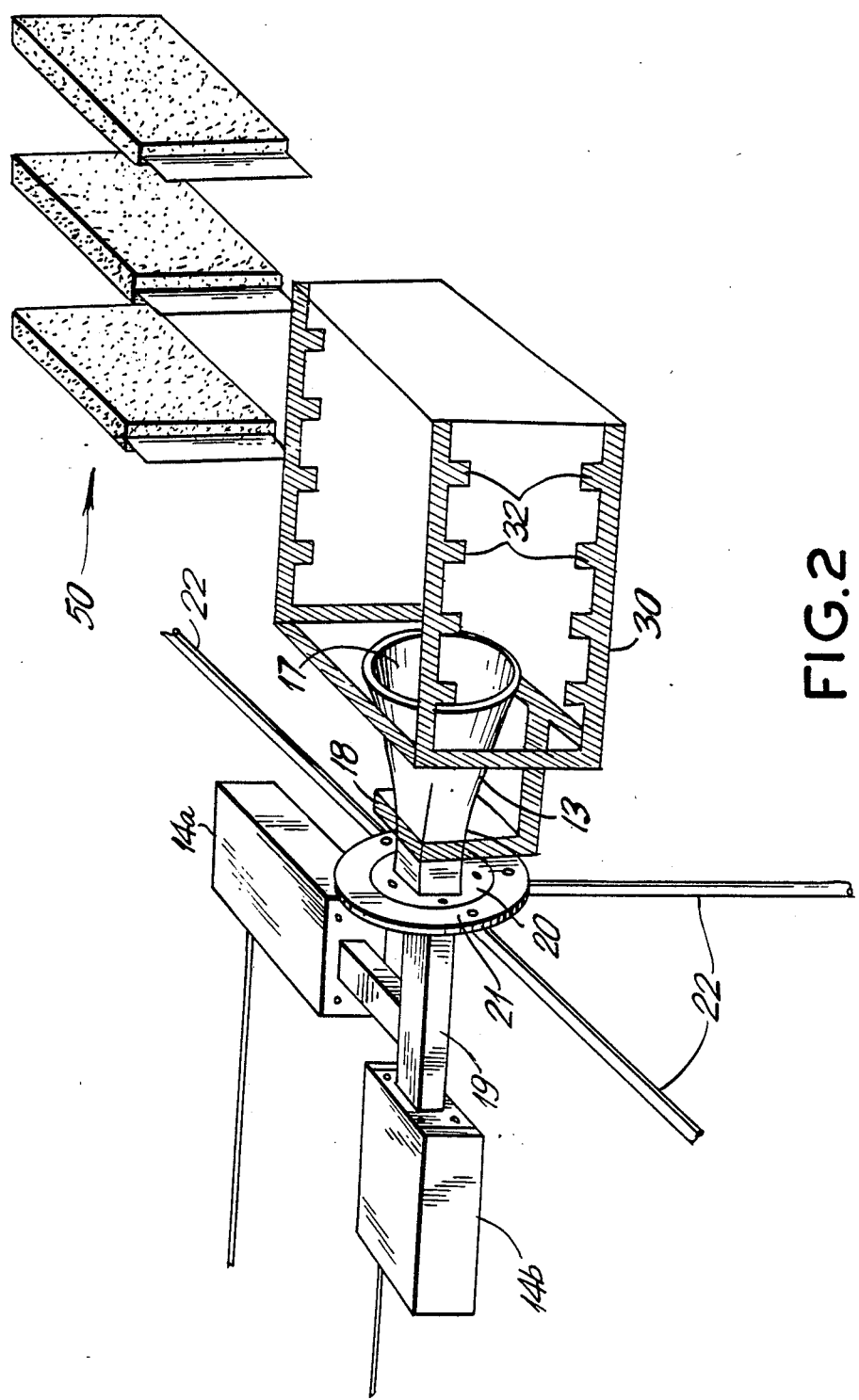
FIG. 2 shows an attenuation pad support for use in the invention and more detail of the interface between the antenna feedhorn and LNA/LNB.

To peak the antenna in accordance with the present invention, calibrated microwave attenuation pads 50 are placed in front of the feedhorn 13, as shown in FIG. 1, to attenuate the received signal to a sufficient degree so that sparklies 25 appear on the screen 24 of the T.V. 23, as illustrated in FIG 3. The pads 50 should be placed as close as possible to the horn 14 and must be large enough to completely block the mouth 17 of the horn 13. The pads 50 can be inserted into a suitable holder 30 as shown in FIG. 2, or be taped or held by an assistant. An attenuation pad 50, as shown in FIG. 5 in the prefered embodiment of the invention, comprises a carbon-loaded polystyrene foam pad 52 packaged in a plastic wrapper 54 to protect against moisture and other factors which could affect attenuation. Preferably, the attenuation factor 55 of each pad 50 is indicated on the label 56 of the wrapper 54.

If the number of black sparklies approximately equals the number of white sparklies, then the receiver 15 is properly tuned to the transponder center frequency. If this is not the case, retuning of receiver 15 is necessary.

The antenna 11 azimuthal and elevational angles are then varied and the effect on reception determined. The position yielding the minimum number of sparklies 25 is the proper alignment. If the sparklies 25 disappear during adjustment, additional pads 50 are added until the sparklies reappear, and the process is repeated. After peaking, one should verify the operational performance of the antenna 11 to ensure compliance with its specifications.

In accordance with the invention, the impulse noise or rain margin of the antenna system can be determined through the use of the calibrated attenuation pads 50. On a clear and cloudless day, when the antenna is properly aligned with the satellite, and with the T.V. 23 turned on, pads 50 are placed in front of the feedhorn 14 as shown in FIG. 1, until sparklies 25 appear on the T.V. screen 24. Sparklies 25 begin to appear on almost all types of T.V, or monitor screens when the received signal is attenuated sufficiently so that the carrier-to-noise ratio is between about 9-10 dB.

The pads 50 attenuate both the satellite's carrier signal and the noise due to external sources. The great majority of the noise making up N, however, is generated by the amplifier of the ground station itself and is not attenuated by the pads 50. Therefore, the use of microwave calibrated attenuation pads 50 does not substantially attenuate the total noise in the system and the carrier-to-noise ratio of the impulse noise threshold can be attained.

The attenuation caused by the pads 50 is additive. For example, if a pad with an attenuation factor of 2 dB is used with a pad with an attenuation of 4 dB, the total attenuation will be 6 dB. Therefore the total attenuation of the carrier signal due to pads 50 is determined by summing attenuation factors 55 indicated on package 56 of each pad.

Figure 6:
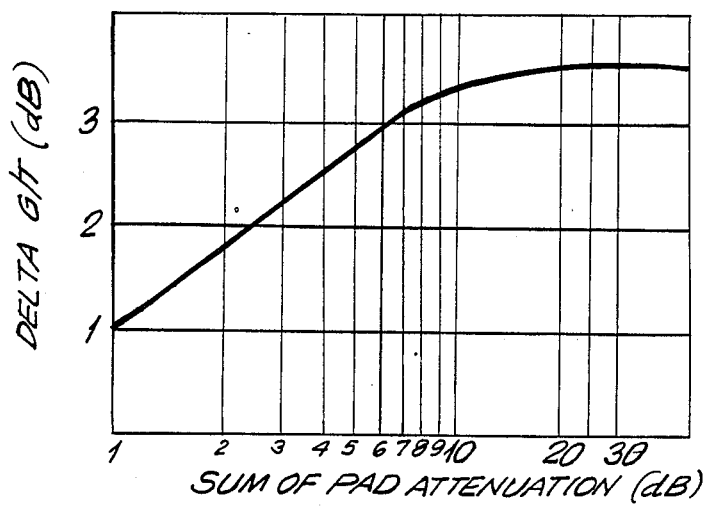
FIG. 6 is a graph of total attenuation versus delta G/T.

Attenuating the carrier signal input to the horn 14 with the calibrated pads 50 also causes an increase in the system noise or system noise temperature. An attenuation pad calibrated in a laboratory cannot take into account the effect of attenuation on the system noise of an earth based receiving system. A typical method of calibration would be to place an attenuation pad 50 between a transmitter and a receiver and comparing the received signal with and without the pad. The receiver could be the probe of a power meter. The decrease in the received signal is the pads' 50 attenuation factor. Such a receiver, however, has a much higher noise figure than a satellite receiver 15 and is not sensitive enough to measure the increase in system noise caused by the attenuation of the pad being calibrated. Therefore, the further decrease in C/N caused by the increase in system noise or system noise temperature due to attenuation, must be determined before the rain margin of the earth based receiving station can be known. The effect of attenuation on the system noise temperature of an antenna 11 is equal to delta G/T. The relation between attenuation and delta G/T is known and is illustrated by the graph in FIG. 6. Delta G/T is determined from this graph for the attenuation of the pads 50 and is added to the total attenuation of the pads 50 to determine the impulse noise or rain margin.

In order to hold the attenuation pads 50 in the proper position blocking the mouth 17 of horn 13, an attenuation pad support 30 can be snapped onto antenna feedhorn 13 at 18, as shown in FIG. 2. The support 30 includes grids 32 for holding the inserted pads 50 and ensuring that the pads 50 are secured in close proximity to mouth 17 of antenna feed 13. Holder 30 is made of a plastic material, such as polyethylene, which is substantially transparent to Ku-band signals.

The tuning of receiver 15 can also be checked while sparklies 25 are on the screen 21 of the T.V. 20 by observing whether the number of black sparklies approximately equals the number of white sparklies. When properly tuned to the transponder center frequency, there should be an equal number of frequency transitions above and below the center frequency of the frequency modulated carrier signal. A white impulse corresponds to a modulated signal above the center frequency and a black impulse corresponds to a modulated signal below the center frequency. An unequal number of white and black sparklies indicates that retuning of receiver 15 is necessary.

The positioning of the antenna to match the polarization of the signal can also be optimized through the use of the microwave calibrated attenuation pads 50. The feedhorn 13 is rigidly connected to the LNB 14 by a means for resolving signal polarity, the orthomode transducer 19, as shown in FIG. 2. FIG. 2 also shows the two separate LNBs of LNB 14, 14a and 14b, for amplifying the horizontal and vertical components of the carrier signal. The orthomode transducer 19 is a waveguide which separates the components of the signal and directs them to one or the other LNB, 14a and 14b, which are already positioned to receive linearly polarized signals. Rotating feedhorn 13, connected to the disk 20 in the base 21, rotates the orthomode transducer 19 relative to the incoming signal. In its proper orientation, the orthomode transducer will be aligned with the horizontal and vertical components of the incoming signal and the maximum energy from each component of the signal will be directed to one or the other LNB 14a and 14b. One can determine the optimum resolution of signal polarity by rotating feedhorn 13 while attenuation pads 50 are in front of the feedhorn 13. The rotational position of the feedhorn 19 yielding the minimum number of sparklies 25 is its optimum alignment. The support 30 and the grids 32 can secure the pads 50 in place while the feedhorn 13 is rotated. Tripod 22 connects rim 21 to the amplifying disk 12.

Figure 4:
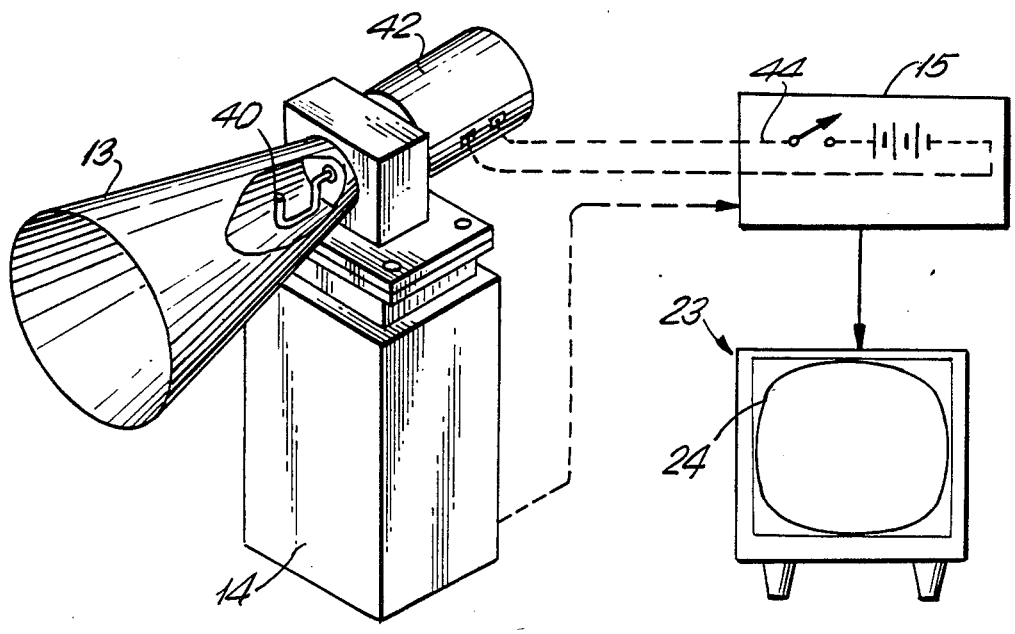
FIG. 4 shows a partial cross section of an alternative configuration of an antenna showing a probe.

In certain applications, for example, when one desires to save the cost of using two LNBs, 14a and 14b, only one component of the transmitted signal can be used for reception. FIG. 4 shows an alternative antenna configuration which utilizes a probe 40 as the means for resolving signal polarization and one LNB 14. Probe 40 is a resonant element which couples the received signal to the LNB 14. The rotational orientation of the probe 40 will align the probe 40 with the horizontal or vertical component of the transmitted signal. This signal component is then directed to the LNB 14 for amplification. The probe 40 is driven by a motor 42. A remote control 44 on the receiver 15 controls the motor 42. With pads placed in front of the feedhorn 13 and sparklies 25 present on the T.V. screen 24, the orientation of probe 40 can be varied by the remote control 44 and the motor 40. The position yielding the minimum number of impulses will be the optimum orientation of the probe 40. The use of such a probe 40 only allows optimal reception of one component of the signal.

Attenuation pads 50 can be made with differing attenuative strengths related to each other by a power of 2, to allow for a more precise determination of the rain margin. For example, the set can contain pads having attenuations of 1, 2, 4, 8 and 16 dB. This would enable one to determine any integral value of rain margin between 1 and 31 dB. Pads having larger or smaller binarily related attenuation values may also be included to give the desired range and precision of measurement. The resolution of such a set of pads would be equal to the pad of the set with the smallest attenuation.

Figure 5A:
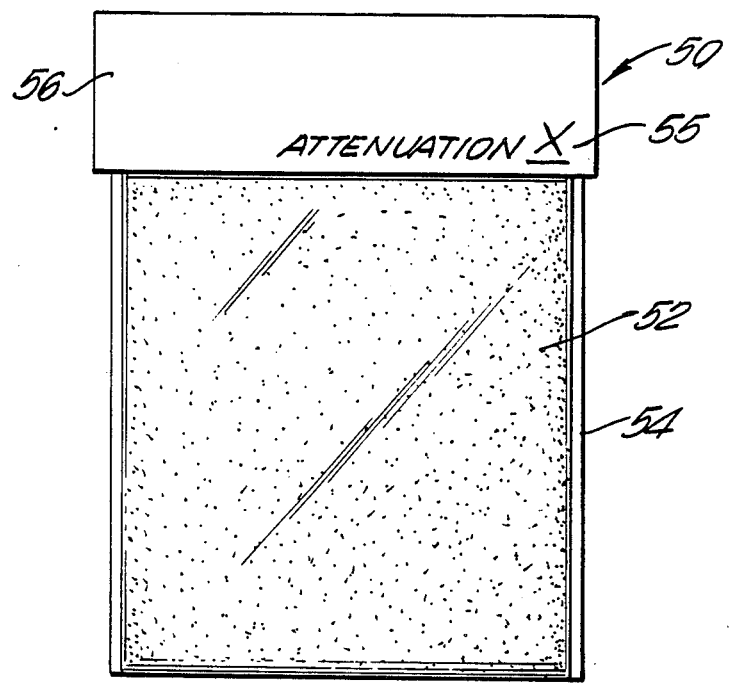
FIG. 5a shows a front view of a packaged calibrated attenuation pad and its label showing the pad's attenuation in decibels.
Figure 5B:
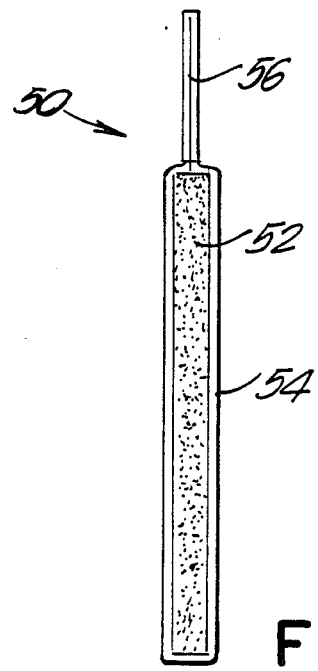
FIG. 5b shows a side view of the packaged calibrated attenuation pad.

Referring now to FIGS. 5a and 5b of the drawings, in the illustrated embodiment of the invention microwave calibrated attenuation pad 50 is comprised of a dielectric carrier pad 52 which is impregnated with a conductor and surrounded by a polyethylene wrapper 54. A prefered pad construction from the point of view of cost and care of handling is a carbon loaded polystyrene foam, but microwave absorbing material can consist of a variety of dielectric carriers made conductive in a variety of ways. See Mooney, "Mastering ESD Plastics in Static Control Products Markets," supra. Any composition providing the necessary attenuation can be used. A polyethylene wrapper 54 protects the pads 50 from moisture or other contamination which could alter its attenuation factor.

Advantages of this configuration include additive and consistent attenuation and a lack of depolarization of the carrier signal. Furthermore, the pads are available off-the-shelf at various attenuative strengths and the manufacture of these products is highly developed. Such materials have been used, for example, as antistatic receptacles for integrated circuits or for removing static electricity from phonograph records. Attenuation pads or antistatic pads of various attenuative strengths can be purchased from companies such as Radio Shack, Emerson & Cuming, and Thomas and Betts.

While the preferred embodiment of the invention described above utilizes the attenuation pads 50, any other means placed ahead of the LNA/LNB for attenuating the signal received by the feed horn so that the effects of changes in the received signal can be observed on a T.V. or monitor screen can also be employed.

In addition, different attenuation devices, such as attenuation pads of differing compositions or a wire grid, could be used to attenuate the received signal in accordance with the methods of the present invention.

Additional operational parameters of an antenna system can be determined based on the measured impulse noise margin. The descrambler dropout threshold is the minimum C/N ratio required to keep the descrambler in synchronization. This is approximately 3-4 dB C/N. The descrambler dropout margin is thus roughly equal to the impulse noise margin plus 6 dB. The total clear sky C/N ratio is about 9-10 dB plus the rain margin.

A variance from specification values substantially larger than the accuracy of measurement could indicate a problem with the antenna equipment or installation or with the transmitting satellite.

The use of calibrated microwave attenuator pads according to the present invention overcomes many of the disadvantages of the prior art. It is a fast, inexpensive and accurate method for determining an earth station's rain margin. The test is non-intrusive, does not disrupt programming for long periods of time, and is easy to perform.

What is claimed is:

1. A method for determining the rain margin of an antenna connected to an operating T.V. set or monitor during a clear and cloudless day, comprising the steps of attenuating the received signal until impulses appear on the screen of said T.V. or monitor; determining the amount of attenuation causing the impulses; and adding delta G/T due to the attenuation to the amount of attenuation causing impulses to yield said antenna's rain margin.

2. The method of claim 1 wherein said attenuating step comprises placing individual attenuating pads having known attenuation factors in front of said antenna's feedhorn until said impulses appear on said screen and said attenuation determination step comprises summing the attenuation factors of each of said pads.

3. The method of claim 1 or 2 further comprising the step of peaking said antenna's alignment after said impulses appear by varying the azimuth and elevation angle of said antenna, monitoring said screen and determining the alignment of said antenna by determining the position which yields a minimum number of impulses.

4. The method of claim 1 or 2 wherein said delta G/T is determined from a graph of attenuation versus delta G/T.

5. The method of claim 2 wherein said pads have differing attenuative strengths and said method further comprises placing pads with different attenuative strengths in front of said antenna's feed to determine the minimum attenuation causing impulses to appear on said screen.

6. The method of claim 2 further comprising attaching a support for holding said pads to said antenna, and wherein said step of placing individual attenuation pads includes the steps of inserting pads into said support until said impulses appear on said screen, said support being substantially transparent to the carrier signals.

7. The method of claim 6 wherein said support is attached to said antenna feed.

8. The method of claim 2 wherein said attenuation pads comprise a dielectric impregnated with a conductor.

9. The method of claim 8 wherein said dielectric includes a plastic foam pad and said conductor includes carbon.

10. The method of claim 1 or 2 further comprising determining the descrambler dropout margin of said antenna by adding 6 dB to said rain margin.

11. The method of claim 1 or 2 further comprising determining the clear sky carrier-to-noise (C/N) ratio by adding 9 dB to said rain margin.

12. The method of claim 1 wherein said receiving antenna is operating in the Ku-band.

13. A method for determining the conformance of a plurality of operational parameters of an antenna to their corresponding applicable specifications by attenuating the carrier signal received by an antenna connected to a TV set or monitor by attenuation means placed forward of the LNA/LNB for causing impulses to appear on the TV or monitor screen, such that the effect of further changes in the received carrier signal on the impulses are observable on the screen of said TV set or monitor and optimizing the antenna orientation for predetermined ones of said plurality of operational parameters by adjusting said orientation and observing a corresponding predetermined effect on the impulses on the TV or monitor.

14. The method of claim 13 wherein said attenuating step further comprises placing attenuation pads in front of said antenna's feedhorn.

15. The method of claim 13 or 14 wherein the operational parameter to be determined is the alignment of said antenna with a satellite, said method further comprising the steps of changing the azimuthal and elevational angles of the antenna after said impulses appear on said screen;

monitoring the effect of the changing step on said impulses; and determining the azimuthal and elevational angle yielding the minimum number of impulses.

16. The method of claim 15 further comprising repeating the placing step if said impulses disappear during the changing of the azimuthal and elevational angles of said antenna and then repeating the changing step and the monitoring step.

17. The method of claim 13 or 14 wherein the operational parameter to be determined is the proper tuning of the receiver of said antenna, said method further comprising the steps of determining whether the number of black impulses approximately equals the number of white impulses, and if they do not, retuning said receiver until they do.

18. The method of claim 13 or 14 wherein the operational parameter to be determined is the optimum positioning of the antenna to match signal polarization and said antenna includes a resolving means for resolving signal polarization, said method further comprising the steps of adjusting the resolving means and determining the adjustment which yields the minimum number of impulses.

19. The method of claim 18 wherein said resolving means is an orthomode transducer connected to said feedhorn and said LNA/LNB such that rotation of said feedhorn rotates said orthomode transducer, said method further comprising the steps of rotating said feedhorn and determining the orientation which yields the minimum number of impulses.

20. The method of claim 18 wherein said resolving means is a probe at the back of said feedhorn and coupled to the amplifier, said method further comprising rotating said probe and determining the orientation yielding the minimum number of impulses.

21. The method of claim 13 or 14 wherein said antenna is a Ku-band antenna.

22. The method of claim 13 wherein said operational parameter to be determined is the impulse noise margin, said method further comprising determining the total amount of attenuation required to cause the impulses to appear on said screen, determining delta G/T based on this total and adding delta G/T to this total to yield the impulse noise margin.

23. The method of claim 14 wherein said operational parameter to be determined is the impulse noise margin and said attenuation pads have known attenuation factors, said method further comprising on a clear and cloudless day steps of summing the attenuation factors of each of said attenuation pads placed in front of said antenna feedhorn;

determining delta G/T of said antenna based on the sum of said attenuation factors; and adding delta G/T to the sum of said attenuation factors to yield the impulse noise margin.

24. The method of claim 22 or 23 wherein said operational parameter to be determined is the descrambler synchronization margin, said method further comprising the step of adding 6 dB to said rain margin.

25. The method of claim 22 or 23 wherein said operational parameter to be determined is the clear sky carrier to noise ratio, said method further comprising the step of adding 9 dB to said rain margin.

26. A set of attenuation pads for use in determining operational parameters of an earth based receiving system, each of said pads in said set having a different known attenuative strength, the attenuation of said pads being related to one a another other such that any attenuation up to the sum of the attenuation of all of said pads of said set can be determined to a resolution equal to the attenuation of the pad of said set having the smallest attenuation.

27. The set of attenuation pads as in claim 26 wherein the attenuation of said pads of said set are related to one another by powers of two.

28. The set of attenuation pads as in claim 27 wherein said set of attenuation pads have values of 1, 2, 4, 8 and 16 dB.

29. The set of attenuation pads as in claim 27 wherein said attenuative pads are comprised of a dielectric and a conductor, said different attenuative strengths being determined by the amount of said conductor present in each pad.

30. The set of attenuation pads as in claim 26 wherein said set includes a support for connecting to said earth based receiving system, said support including grids for holding said attenuation pads in close proximity to the antenna feedhorn of said earth based receiving system.

* * * * *